United States Patent
Villarico et al.

(10) Patent No.: US 10,743,435 B1
(45) Date of Patent: *Aug. 11, 2020

(54) MODULAR DEVICE CONNECTOR

(71) Applicant: Netflix, Inc., Los Gatos, CA (US)

(72) Inventors: Denzil Villarico, San Jose, CA (US); Marcus Davis, Emerald Hills, CA (US); Justin Phelps, Los Gatos, CA (US)

(73) Assignee: Netflix, Inc., Los Gatos, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/733,944

(22) Filed: Jan. 3, 2020

Related U.S. Application Data

(63) Continuation of application No. 16/457,564, filed on Jun. 28, 2019, now Pat. No. 10,582,633.

(51) Int. Cl.
*H05K 7/14* (2006.01)
*G06F 1/18* (2006.01)

(52) U.S. Cl.
CPC .......... *H05K 7/1447* (2013.01); *G06F 1/183* (2013.01)

(58) Field of Classification Search
CPC .. H05K 7/1447; H05K 7/1448; H05K 7/1449; H05K 7/1451; H05K 7/14;
(Continued)

(56) References Cited

U.S. PATENT DOCUMENTS

| | | | | |
|---|---|---|---|---|
| 4,134,631 A | * | 1/1979 | Conrad | H05K 7/1448 439/50 |
| 5,224,020 A | * | 6/1993 | Golledge | H05K 7/1429 361/679.33 |

(Continued)

FOREIGN PATENT DOCUMENTS

| | | |
|---|---|---|
| AU | 199897968 A1 | 5/1999 |
| EP | 2 686 979 B1 | 1/2015 |

(Continued)

OTHER PUBLICATIONS

Notice of Allowance received for U.S. Appl. No. 16/457,564 dated Oct. 7, 2019, 19 pages.

*Primary Examiner* — Timothy J Thompson
*Assistant Examiner* — Amol H Patel
(74) *Attorney, Agent, or Firm* — FisherBroyles, LLP

(57) ABSTRACT

The disclosed apparatus may include a rack-side support structure dimensioned to hold a two-sided port interface with a rack-side mating end and an adapter-side mating end. The rack-side mating end may be configured to interface with supply cables, and the adapter-side mating end may be configured to interface with an opposite adapter-side mating end of another port interface. The apparatus may also include a device-side support structure dimensioned to hold a two-sided port interface including an opposing adapter-side mating end and a device-side mating end. The opposing adapter-side mating end may be configured to interface with the adapter-side mating end of the rack-side's port interface, and the device-side mating end may interface with cables that connect to the electronic devices. The rack-side support structure may be configured to interlock with the device-side support structure to connect to the electronic devices. Various other methods, systems, and computer-readable media are also disclosed.

20 Claims, 12 Drawing Sheets

(58) Field of Classification Search
CPC .. H05K 7/1489; H05K 5/0021; H05K 5/0247; H05K 5/0256; H05K 5/026; H05K 5/0286; H05K 5/0291; G06F 1/183
See application file for complete search history.

(56) References Cited

U.S. PATENT DOCUMENTS

| | | | | |
|---|---|---|---|---|
| 5,388,995 | A * | 2/1995 | Rudy, Jr. | H05K 7/1449 |
| | | | | 439/61 |
| 6,267,628 | B1 | 7/2001 | Meckley et al. | |
| 6,538,904 | B1 | 3/2003 | Isely et al. | |
| 9,818,452 | B2 * | 11/2017 | Wang | G06F 1/187 |
| 2004/0160226 | A1 * | 8/2004 | Ewing | G01R 31/2808 |
| | | | | 324/538 |
| 2014/0008370 | A1 * | 1/2014 | Judd | H05K 7/00 |
| | | | | 220/500 |
| 2017/0093102 | A1 * | 3/2017 | Huang | H01R 12/721 |
| 2018/0228042 | A1 * | 8/2018 | Blersch | H05K 5/0278 |

FOREIGN PATENT DOCUMENTS

| | | |
|---|---|---|
| WO | 2006/015129 A2 | 2/2006 |
| WO | 2017/172960 A1 | 10/2017 |
| WO | 2018/165538 A1 | 9/2018 |

\* cited by examiner

MODULAR DEVICE CONNECTOR

CROSS REFERENCE TO RELATED APPLICATION

This application is a continuation of U.S. application Ser. No. 16/457,564, filed Jun. 28, 2019, the disclosure of which is incorporated, in its entirety, by this reference.

BACKGROUND

Many current software applications are designed to operate on a wide variety of different electronic devices. For example, a video streaming application may be designed to operate on smartphones, tablets, laptops, PCs, gaming consoles, television streaming devices, in-home entertainment hubs, and other electronic devices. Each time changes are made to the application, the application must be tested to ensure that the changes have not broken any core functionality. This testing is typically carried out on a host of different test devices. For example, a testing lab may include and use many tens, hundreds, or thousands of different electronic devices to test the application. Various software and hardware tests may be run on each of the different devices to ensure core functionality works as intended.

Managing such a large number of test devices can, however, become burdensome. Each time an electronic device under test has a hardware or software failure or freezes and becomes unresponsive, the device must be removed from the testing rack and a new device must be positioned in its place. To remove a device from the testing rack, an information technology (IT) worker must reach behind the device, unplug all of the cables, and then reach behind the device again to plug in those same cables into the new device. This inefficient form of plugging and unplugging the devices can be time consuming, especially when managing large numbers of test devices.

SUMMARY

As will be described in greater detail below, the present disclosure describes a system and apparatus for connecting multiple supply cables to an electronic device in a simple and efficient manner.

In one embodiment, an apparatus may be provided that includes a rack-side support structure dimensioned to hold at least one two-sided port interface. The two-sided port interface may include a rack-side mating end and an adapter-side mating end. The rack-side mating end may be configured to interface with various supply cables configured to provide input/output (I/O) channels to different electronic devices. The adapter-side mating end may be configured to interface with an opposite adapter-side mating end of another port interface. The apparatus may also include a device-side support structure dimensioned to hold at least one two-sided port interface including an opposing adapter-side mating end and a device-side mating end. The opposing adapter-side mating end may be configured to interface with the adapter-side mating end of the rack-side's port interface. The device-side mating end may interface with supply cables that connect to the electronic devices. The rack-side support structure may be configured to interlock with the device-side support structure, aligning the adapter-side mating end of the rack-side support structure's port interface with the opposing adapter-side mating end of the device-side's port interface. As such, when interlocked, the rack-side supply cables connect through the rack-side and device-side port interfaces to the electronic devices.

In some examples, the rack-side support structure may be coupled to a device rack. In some examples, the rack may include a spring-loaded compartment configured to hold the electronic devices in place. In some examples, the device-side support structure may be coupled to one of the electronic devices. In some examples, the device-side support structure may be configured to couple to a multiple different consumer electronic devices. In some examples, the rack-side support structure may be dimensioned to couple to multiple different device racks. In some examples, the rack-side support structure may be dimensioned to hold multiple ports. In some examples, at least two of the ports may be different types of ports. As such, the rack-side support structure may hold multiple different types of ports.

In some examples, the device-side support structure may be dimensioned to couple to multiple different electronic devices. In some examples, at least some of the electronic devices may be of different sizes. In some examples, at least one of the electronic devices may be a device under test. In some examples, the rack-side support structure may be slidably coupled to a device rack. As such, the rack-side support structure may be permitted to slide between a first position and a second position within the device rack. In some examples, the device rack may include a support bar onto which multiple rack-side support structures are slidably coupled. In some examples, the apparatus may further include a clasp that is configured to hold the interlocked rack-side support structure and device-side support structure in place.

In addition, a corresponding system may include a rack-side support structure dimensioned to hold at least one two-sided port interface. The two-sided port interface may include a rack-side mating end and an adapter-side mating end. The rack-side mating end may be configured to interface with various supply cables configured to provide input/output (I/O) channels to different electronic devices. The adapter-side mating end may be configured to interface with an opposite adapter-side mating end of another port interface. The system may also include a device-side support structure dimensioned to hold at least one two-sided port interface including an opposing adapter-side mating end and a device-side mating end. The opposing adapter-side mating end may be configured to interface with the adapter-side mating end of the rack-side's port interface. The device-side mating end may interface with supply cables that connect to the electronic devices. The rack-side support structure may be configured to interlock with the device-side support structure, aligning the adapter-side mating end of the rack-side support structure's port interface with the opposing adapter-side mating end of the device-side's port interface. As such, when interlocked, the rack-side supply cables connect through the rack-side and device-side port interfaces to the electronic devices In some examples, a method of manufacturing may be provided for manufacturing a modular device connector. The method of manufacturing may include providing a rack-side support structure dimensioned to hold at least one two-sided port interface. The two-sided port interface may include a rack-side mating end and an adapter-side mating end. The rack-side mating end may be configured to interface with various supply cables configured to provide input/output (I/O) channels to different electronic devices. The adapter-side mating end may be configured to interface with an opposite adapter-side mating end of another port interface. The method of manufacturing may also include providing a device-side support structure dimensioned to hold a two-sided port interface including an opposing adapter-side mating end and a device-side mating end. The opposing adapter-side mating end may be configured to interface with the adapter-side mating end of the rack-side's port interface and the device-side mating end may interface with supply cables that connect to the different electronic devices.

In some examples, the method of manufacturing may further include interlocking the rack-side support structure with the device-side support structure to align the adapter-side mating end of the rack-side support structure's port interface with the opposing adapter-side mating end of the device-side's port interface. In some examples, when the rack-side support structure and the device-side support structure are interlocked, the rack-side supply cables may connect through the rack-side and device-side port interfaces to the different electronic devices.

Features from any of the embodiments described herein may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the present disclosure.

Figure 1:
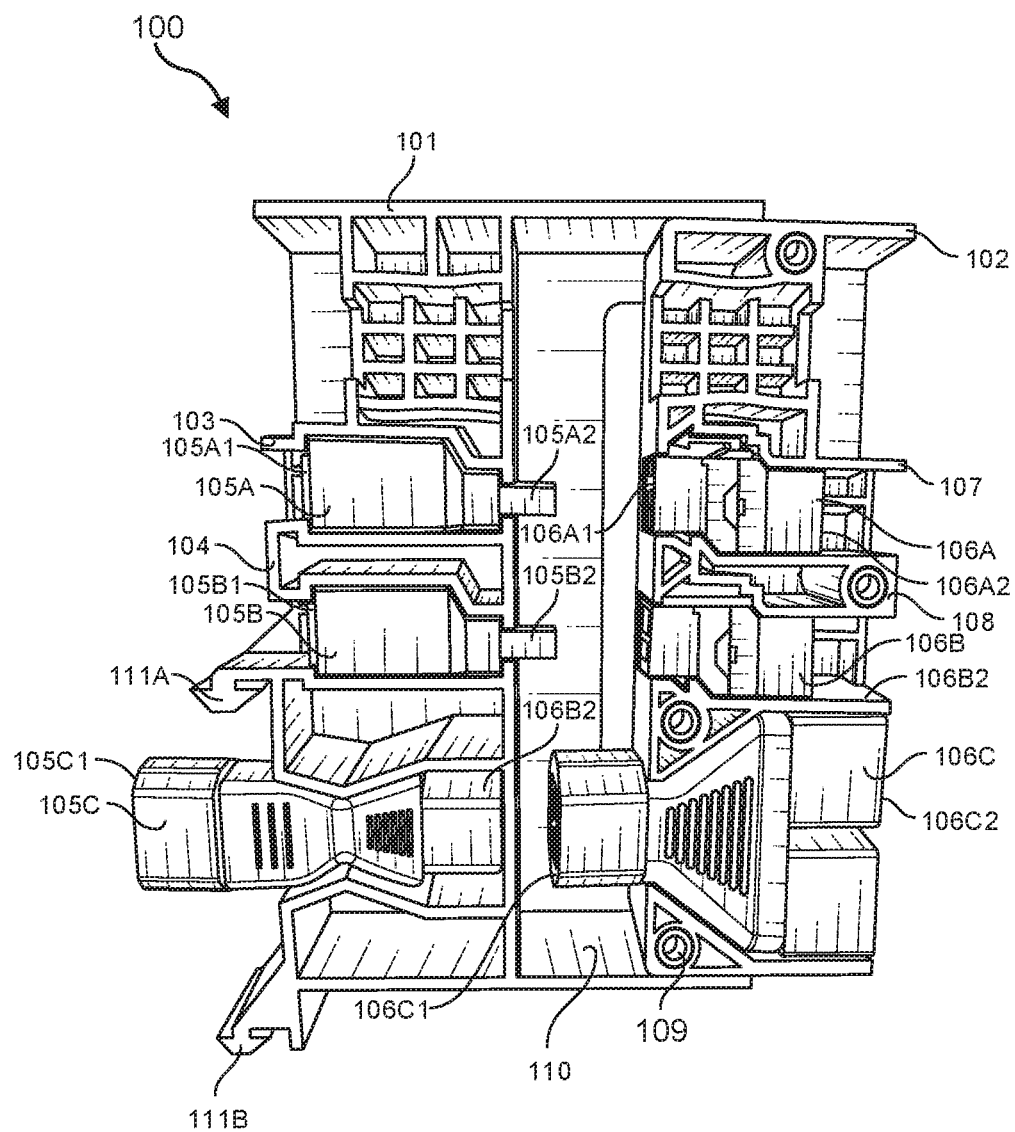
FIG. 1 illustrates an embodiment of a modular device connector with one or more component elements.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the present disclosure covers all modifications, equivalents, and alternatives falling within the scope of the appended claims.

DETAILED DESCRIPTION OF EXEMPLARY EMBODIMENTS

The present disclosure is generally directed to a modular device connector that may be configured to connect electronic devices to various supply cables. These supply cables may provide power, network data, peripheral device connections, or other connections. As noted above, electronic devices used to test software may be organized in device testing racks. These testing racks may house many different devices including different types of devices. Unplugging and removing these devices may be time-consuming and burdensome. Similarly, placing new devices into the rack and plugging those devices into the supply cables may also take time that could otherwise be used for other, perhaps more important tasks.

Accordingly, as will be explained in greater detail below, embodiments of the present disclosure may include a modular device connector with one or more component parts. One of these component parts may be a rack-side support structure. The rack-side support structure may be coupled to a device testing rack. The rack-side support structure may be dimensioned to hold different types of port interfaces including at least one two-sided port interface. The two-sided port interface may include a rack-side mating end and an adapter-side mating end. The rack-side mating end may be configured to interface with rack-side supply cables configured to provide input/output (I/O) channels to different electronic devices. The adapter-side mating end may be configured to interface with an opposite adapter-side mating end of another port interface.

This embodiment may also include a corresponding device-side support structure that may be coupled to an electronic device. The device-side support structure may be dimensioned to hold different types of port interfaces including at least one two-sided port interface. The two-sided port interface may include an opposing adapter-side mating end and a device-side mating end. The opposing adapter-side mating end may be configured to interface with the adapter-side mating end of the rack-side's port interface. The device-side mating end may interface with supply cables that connect to the electronic devices. The rack-side support structure may be configured to interlock with the device-side support structure, aligning the adapter-side mating end of the rack-side support structure's port interface with the opposing adapter-side mating end of the device-side's port interface. As such, when interlocked, the rack-side supply cables connect through the rack-side and device-side port interfaces to the electronic devices.

The following will provide, with reference to FIGS. 1-12, detailed descriptions of different embodiments of modular device connectors. For example, although the modular device connector may take many different forms, shapes, and sizes, the embodiment illustrated in FIG. 1 may be illustrative. The modular device connector 100 of FIG. 1 may include a rack-side support structure 101 dimensioned to hold at least one two-sided port interface (e.g., 105A). The two-sided port interface may include a rack-side mating end 105A1 and an adapter-side mating end 105A2. The port interface may be substantially any type of port interface including a power interface, a networking interface (e.g., Ethernet), an audio/video interface (e.g., HDMI), a device interface (e.g., USB), or any other type of port interface capable of receiving a connecting interface.

In some cases, the rack-side mating end 105A1 may be configured to interface with supply cables that provide input/output (I/O) channels to different electronic devices. The rack-side mating end 105A1 (or 105B1/105C1) may include female connectors configured to receive supply cables with male connectors. The supply cables may come from a rack or other source. The supply cables may be inserted into the rack-side mating ends 105A1-105C1 to provide the requisite power, data, or device connection. The port interfaces 105A-105C may include electronic hardware such as connectors, wires, pins, and/or electronic circuits that transfer the incoming signals from the supply cables to the adapter-side mating ends 105A2-105C2.

The adapter-side mating ends 105A2-105C2 may be configured to interface with an opposite adapter-side mating end of another port interface. For example, the rack-side support structure 101 may include multiple port interfaces 105A-105C that connect to corresponding port interfaces 106A-106C in the device-side support structure 102. The device-side support structure 102 may be dimensioned to hold multiple different port interfaces including more or fewer than the three shown in FIG. 1 (e.g., interfaces 106A-106C). These port interfaces may be designed to interlock with the interfaces of the rack-side support structure and with the electronic devices. For example, at least one of the port interfaces 106A-106C may be a two-sided port interface that has an opposing adapter-side mating end (e.g., 106A1) and a device-side mating end (e.g., 106A2).

The opposing adapter-side mating end 106A1 may be configured to interface with the adapter-side mating end 105A2 of the rack-side's port interface 105A. The device-side mating end 106A2 may interface with different supply cables that connect from the device-side mating end to the electronic device. As such, a completed connection from left to right in FIG. 1 may start from a supply cable to a rack-side mating end 105A1 of the port interface 105A. The adapter-side mating end 105A2 may connect to the adapter-side mating end 106A1 of the corresponding port interface 106A. A supply cable may then be connected to the device-side mating end 106A2 of the port interface 106A and to the electronic device. Because the rack-side support structure 101 may already be connected to a rack (and may remain that way), and because the device-side support structure 102 may already be connected to an electronic device, an IT worker or other user may simply grasp the electronic device from the front of the device and slide it back until the adapter-side mating ends of the device-side structure meet with the adapter-side mating ends of the rack-side support structure. Because the adapter-side mating ends oppose each other and are opposite gender (male or female), the device-side support structure 102 may slide into the rack-side support structure 101 and connect the port interfaces together, thereby connecting the supply cables of the rack to the supply cables of the electronic device.

In some embodiments, the rack-side support structure 101 may interlock with the device-side support structure 102. This interlocking may hold the rack-side support structure 101 and the device-side support structure 102 in place relative to the rack. This may prevent the device-side support structure 102 from coming unplugged from the rack-side support structure 101. In some cases, the interlocked rack-side support structure 101 and the device-side support structure 102 may be held in place with a latch or a clasp that may be undone prior to unplugging the device-side support structure 102. The interlocking of the rack-side support structure 101 and the device-side support structure 102 may align the adapter-side mating end (e.g., 105B2) of the rack-side support structure's port interface (e.g., 105B) with the opposing adapter-side mating end (e.g., 106B1) of the device-side's port interface (e.g., 106B). As such, when interlocked, the rack-side supply cables may connect through the rack-side and device-side port interfaces to the electronic devices.

Figure 2:
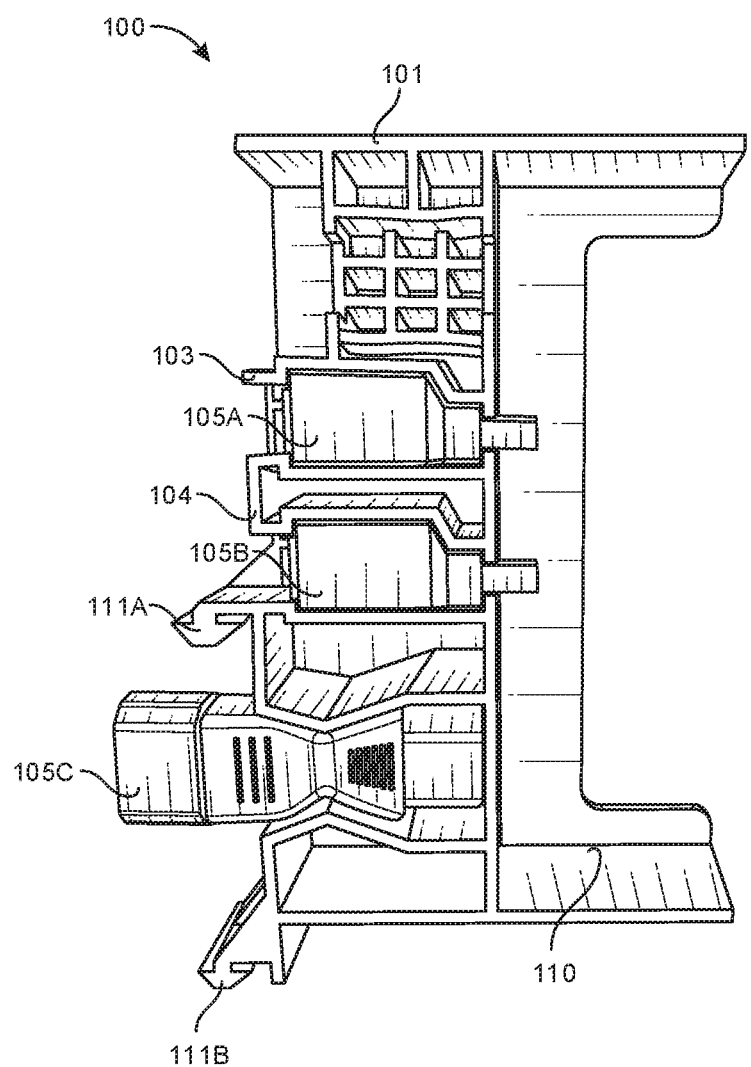
FIG. 2 illustrates an embodiment of a portion of a modular device connector with one or more component elements.
Figure 3:
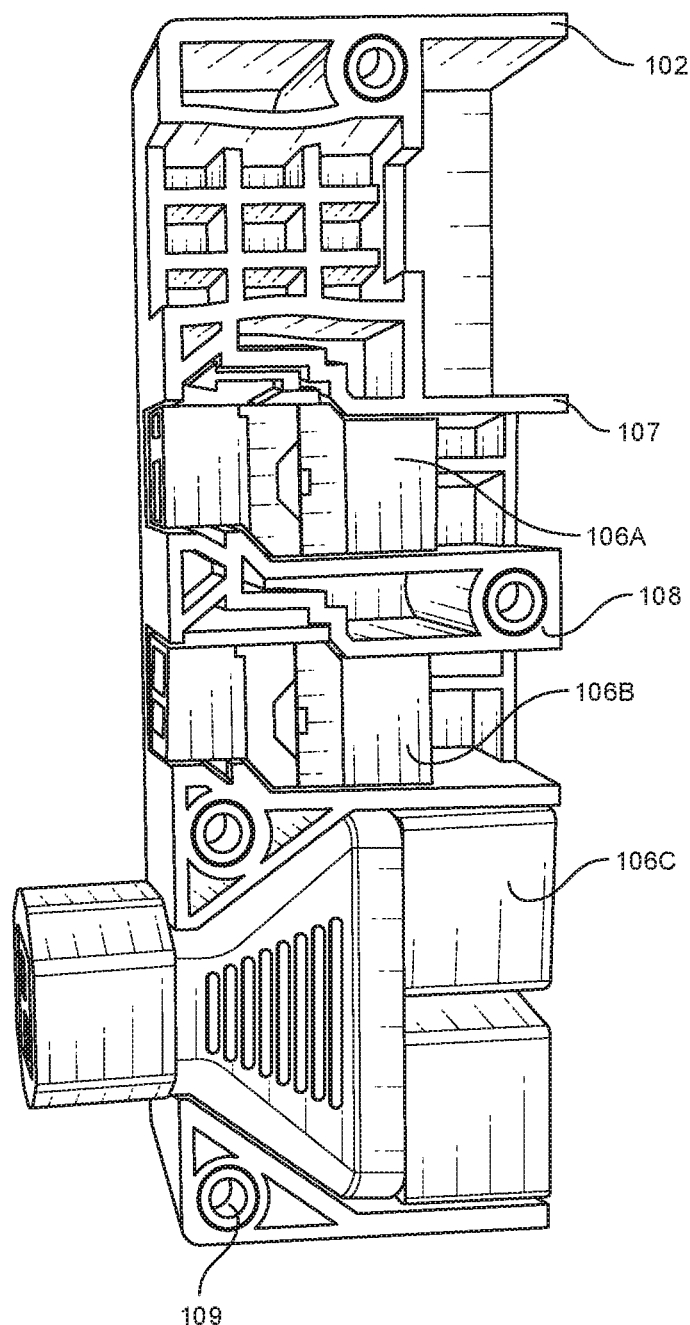
FIG. 3 illustrates an embodiment of a corresponding portion of a modular device connector with one or more component elements.

FIG. 2 illustrates an embodiment of the rack-side support structure 101 from apparatus 100 of FIG. 1. The rack-side support structure 101 may include one or more nobs, notches, rails, slides, or other connecting, clasping, or latching elements that allow the rack-side support structure 101 to couple to a device rack (e.g., device rack 160 of FIG. 6). For example, the rack-side support structure 101 may include coupling elements 111A and/or 111B. In some embodiments, these coupling elements 111A/111B may allow the rack-side support structure 101 to couple to a device rack. In some cases, the coupling elements 111A/111B may slidably couple the rack-side support structure 101 to the device rack. As such, the rack-side support structure 101 may be free to slide along a rail of the device rack. This may allow an IT worker or other user to reposition electronic devices within the rack without having to unplug those devices. Indeed, when supply cables are connected through the port interfaces of the rack-side support structure 101, through the port interfaces of the device-side support structure 102 (shown in FIG. 3), and to the electronic device, these cables may stay plugged in while the apparatus 100 is slid up or down the rails.

Figure 4:
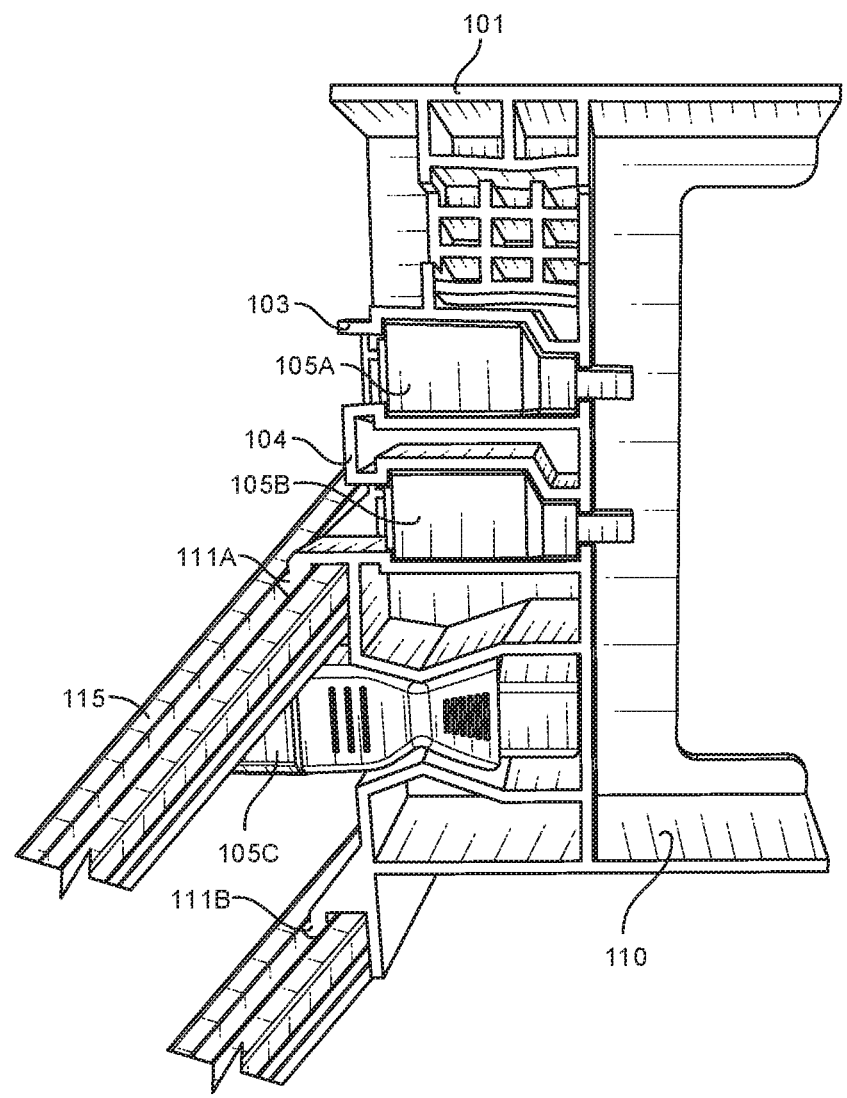
FIG. 4 illustrates an embodiment in which a modular device connector is coupled to a rack.
Figure 5A:
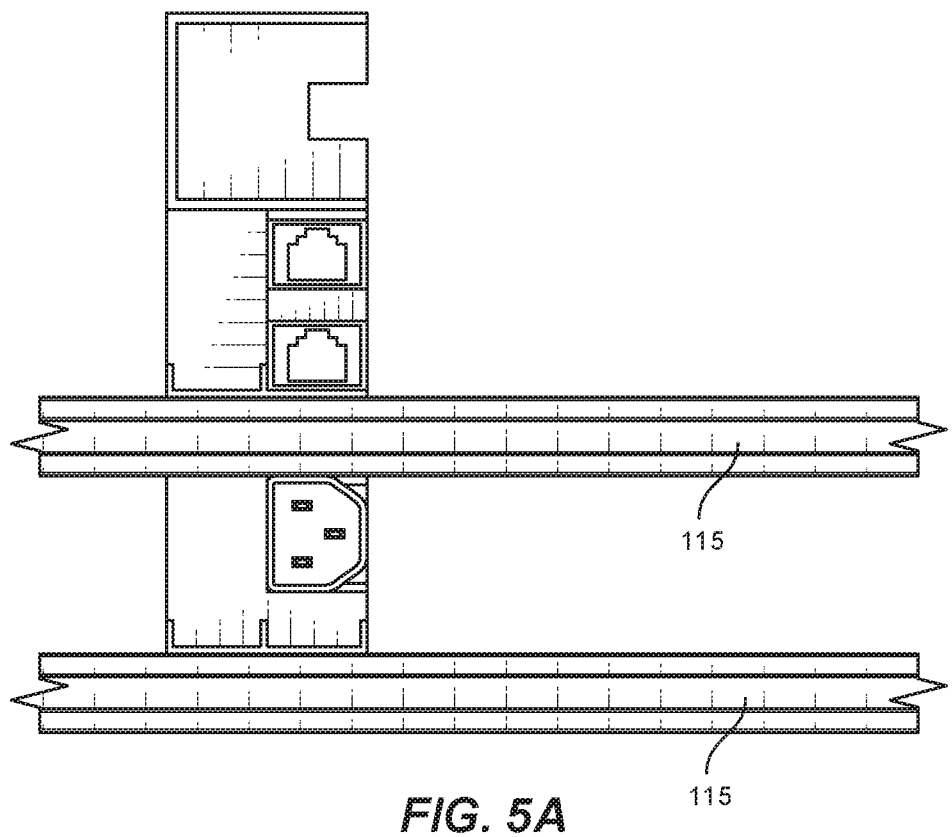
FIGS. 5A and 5B illustrate embodiments in which the modular device connector is slidably coupled to a rack and is slid from one position to another.
Figure 5B:
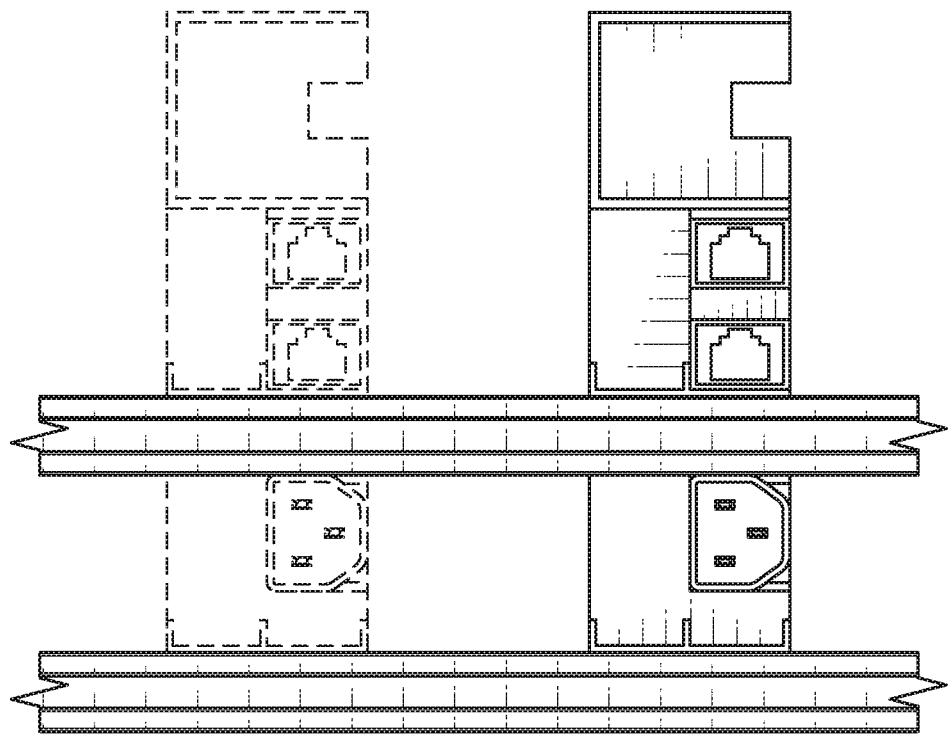

For example, as shown in FIG. 4, the rack-side support structure 101 may be slidably coupled to a support bar or rail 115. In some embodiments, the rail 115 may be a single rail, while in other cases (such as those shown in FIGS. 4 & 5A-5B), the rail may be split into multiple sections. In FIGS. 4 & 5, the rail 115 may include notches or grooves into which the coupling elements 111A/111B may be inserted. Such a tongue and groove connection may allow the apparatus 100 to slide up and down the rail 115. The connection may hold the apparatus 100 in place but may also all the apparatus to be removed when necessary. As shown in FIGS. 5A and 5B, a split rail 115 may allow for various connections including power connections (e.g., 105C) to be situated between rail portions. As noted in FIG. 5B, the rack-side support structure 101 may be slid from one position (indicated by dotted lines) to a new position (indicated by solid lines). Thus, the IT manager may have large amount of control over where the devices are placed within a rack, even while those devices are plugged in.

Figure 6:
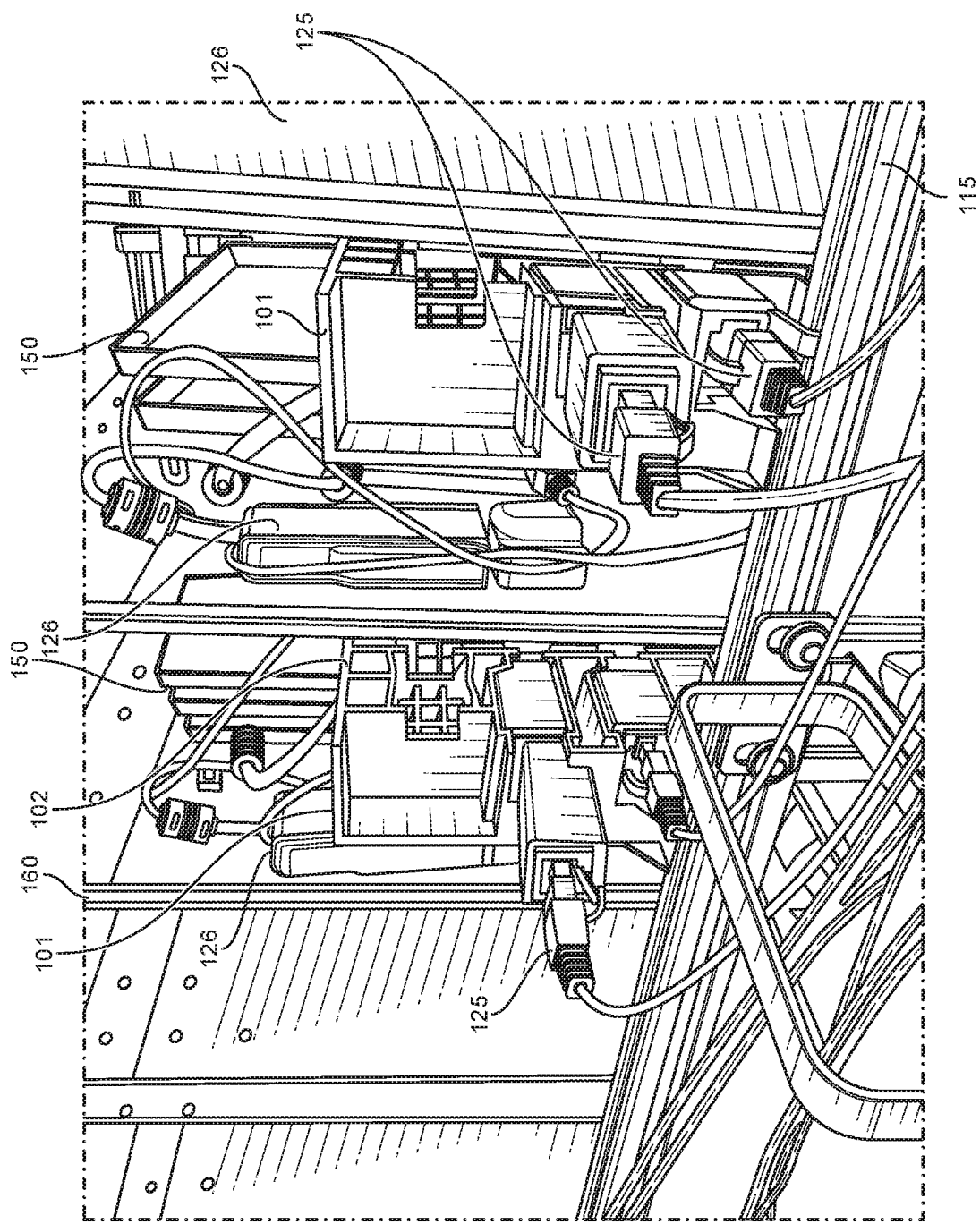
FIG. 6 illustrates an embodiment in which multiple modular device connectors are coupled to a rack.

FIG. 6 illustrates an embodiment of a device rack 160 configured to house multiple different electronic devices 150. Each electronic device may be coupled to a modular device connector (e.g., 100 of FIG. 1) which includes the rack-side support structure 101 and the device-side support structure 102. In FIG. 6, the various rack-side support structures 101 are more visible than the corresponding device-side support structures 102. Each rack-side support structure 101 may have one or more supply cables 125 feeding in to the rack-side mating end of the various port interfaces. As in FIGS. 4 and 5A-5B, the rack-side support structures 101 may be connected to the rail 115. The rail 115 may be fixedly attached to the rack 160 and, as such, may provide a firm mounting point for the modular device connectors. In some cases, instead of cables traveling directly from the device-side support structure 102 to the electronic device 150, the cables may pass through a power converter 126, through an adapter (e.g., DVI to HDMI, etc.), or through other electronic components before reaching the electronic device.

The device rack 160 may be configured to hold many different types of electronic devices. For example, the device-side support structure 102 may be configured to couple to a multiple different consumer electronic devices. These may be gaming consoles, smartphones, PCs, laptops, tablets, wearable devices, or other electronic devices. The device-side support structure 102 may fashioned in many different forms in order to fit properly against the back end of the device. Then, when the device is pulled toward a user, the plugs separate at the juncture between the rack-side support structure 101 and the device-side support structure 102. The rack-side support structure 101 may stay slidably attached to the device rack 160, and the device-side support structure 102 may stay attached to the electronic device.

Figure 7:
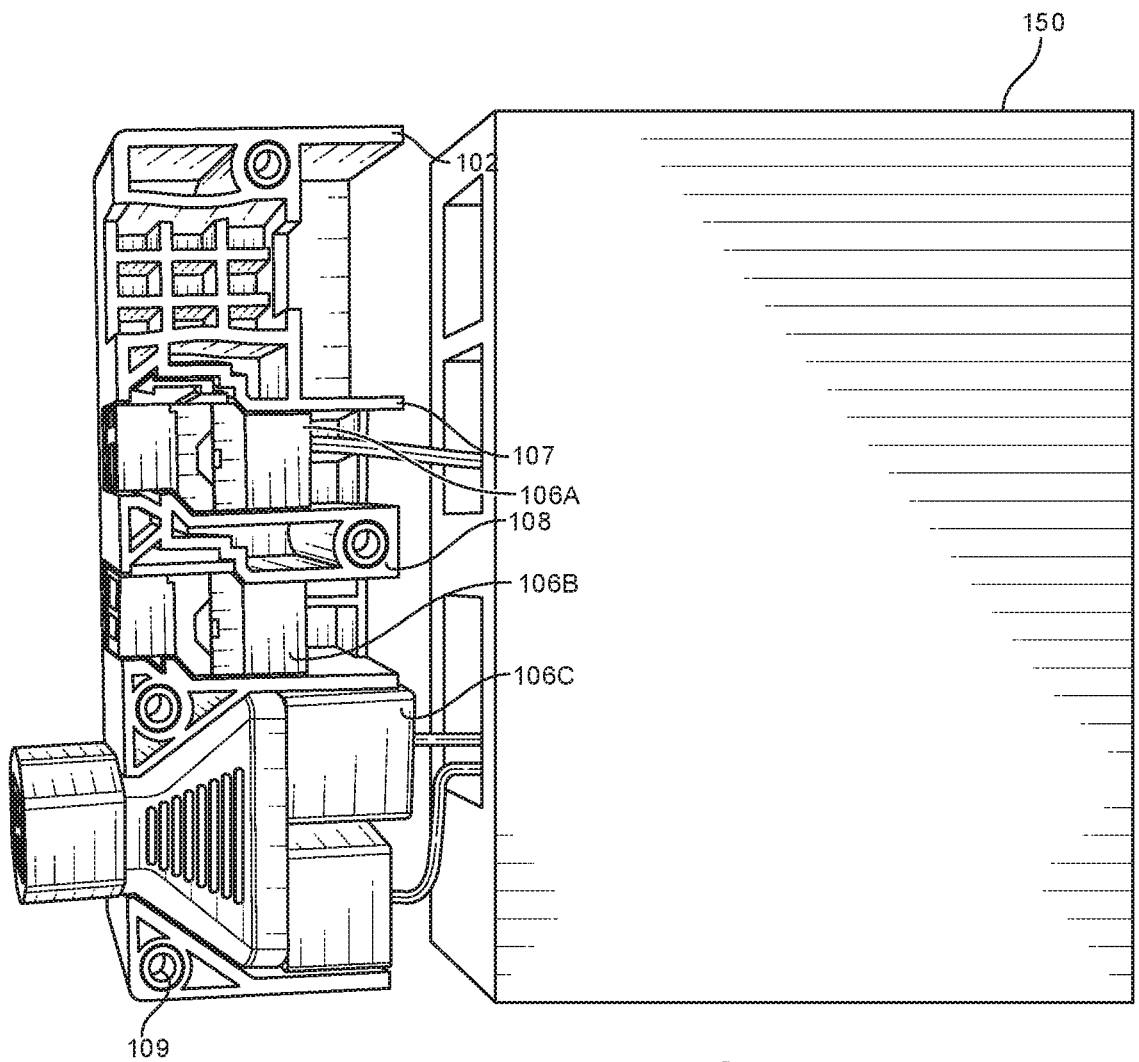
FIG. 7 illustrates an embodiment of a portion of a modular device connector coupled to an electronic device.

For example, as shown in FIG. 7, the device-side support structure 102 may be attached to a gaming console 150. In some cases, screw holes 109 may be used to attach the device-side support structure 102 to the device. Each modular device connector (e.g., 100 of FIG. 1) may include many different port interfaces. Although three port interfaces are shown in FIG. 7, it will be understood that the device-side support structure 102 may be dimensioned to hold substantially any number of port interfaces of substantially any shape or size. The device-side support structure 102 (and the rack-side support structure 101) may include cutout portions 107 and 108 that may house the port interfaces (103/104 for corresponding port interfaces in the rack-side support structure 101). The rack-side and device-side support structures may also include voids or spaces 110 that allow other items to fill the space. For instance, space 110 may allow sufficient room to allow for the rack-side support structure 101 and the device-side support structure 102 to be slid together.

Figure 8:
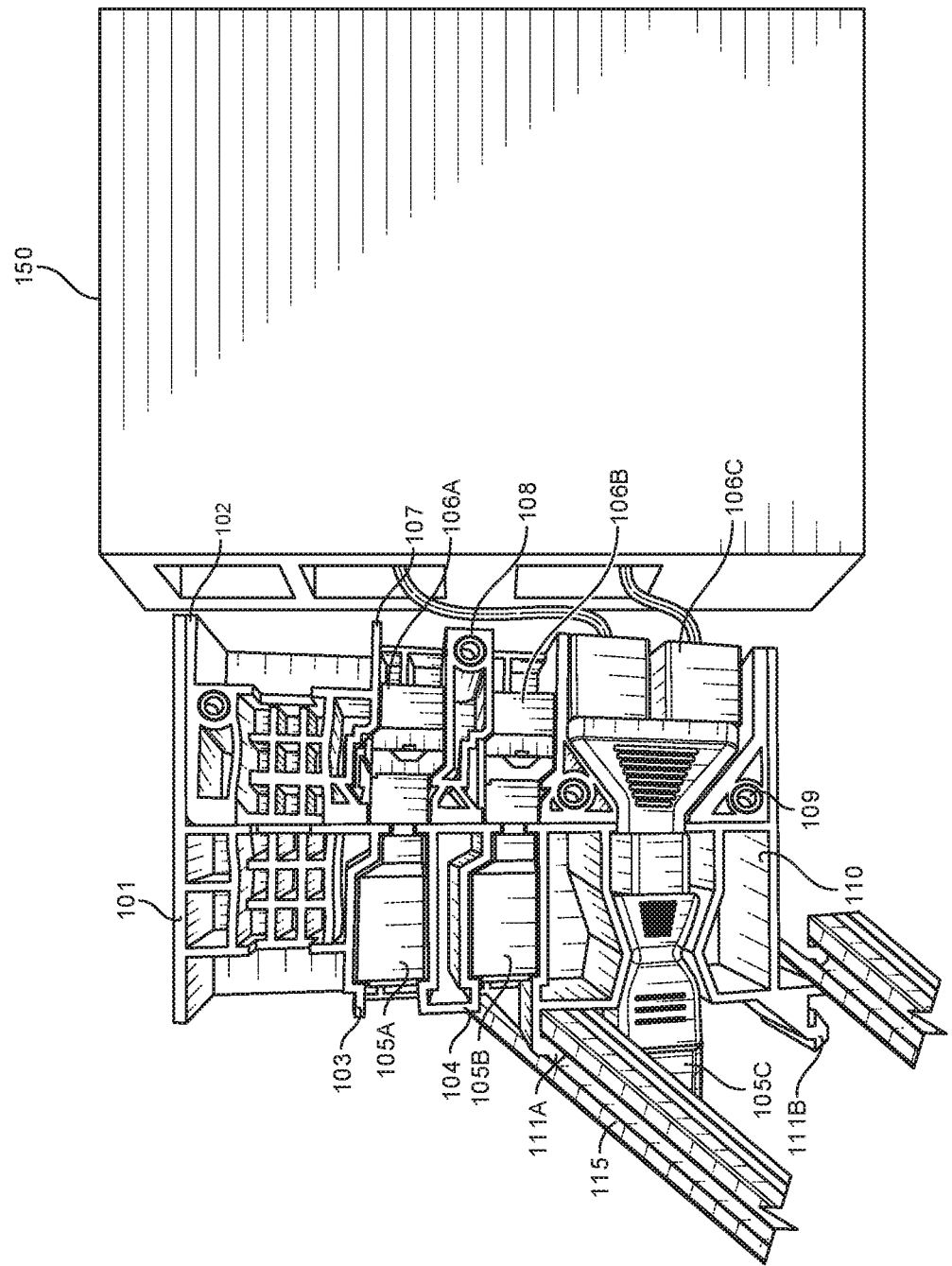
FIG. 8 illustrates an embodiment of a portion of a modular device connector coupled to a rack and to an electronic device.

When slid fully together, as shown in FIG. 8, each of the port interfaces 105A-105C may be connected to the corresponding port interfaces 106A-106C. Thus, with one movement, an IT worker or other user may slide the device-side support structure 102 into the space 110 and, when fully slide into that space, may connect the various port interfaces. This motion may thus connect the supply cables 125 of FIG. 6 to the electronic devices 150. Regardless of how many port interfaces are in the modular device connector, each port interface may be simultaneously connected in a single move. In some embodiments, the rack-side support structures 101 may be standard for a given rack and as such, may each look the same and may be dimensioned the same.

However, different device-side support structures 102 may be created that correspond to the dimensions of the PC, laptop, gaming console, or other device under test. Thus, a bespoke device-side support structure 102 may couple to the electronic device on the device-side mating end but may couple to the standardized adapter-side mating ends of the port interfaces on the rack-side support structure 101. In this manner, many different devices under test may be plugged in and unplugged from the rack simply by pulling the device out of the rack or pushing it in to the back. The IT worker no longer needs to reach back and fiddle with cables each time a device is changed out. Rather, the modular device connector 100, acting as an intermediary between the supply cables 125 and the device cables, may allow a quick and secure connection to be made simply by sliding the electronic device back into the rack 160.

Figure 9:
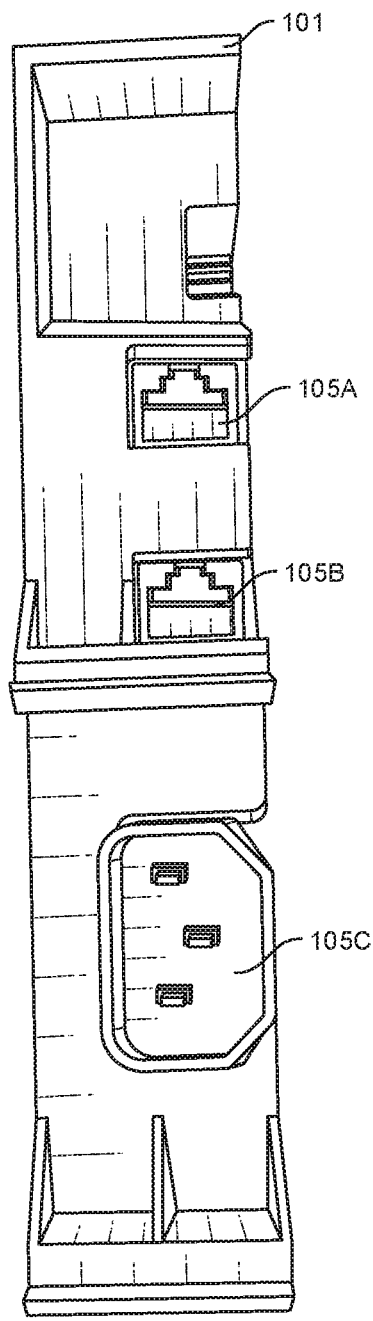
FIG. 9 illustrates a side view of an embodiment of a portion of a modular device connector.
Figure 10:
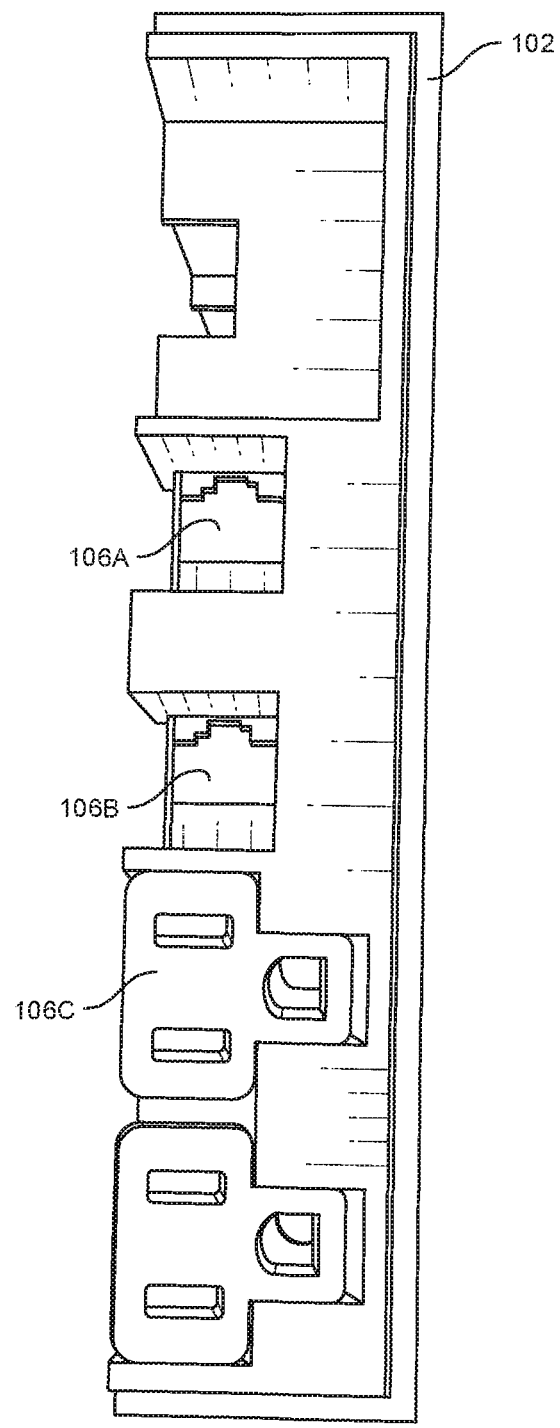
FIG. 10 illustrates an alternative side view of an embodiment of a portion of a modular device connector.

FIGS. 9 and 10 illustrate side views of the rack-side support structure 101 and the device-side support structure 102, respectively. Although networking and power ports are shown in FIGS. 9 and 10, it will be recognized that substantially any type of port interface may be used. In this example embodiment, port interfaces 105A and 105B are networking interfaces, while port interface 105C is a male power interface. In FIG. 10, port interfaces 106A and 106B are corresponding networking interfaces that allow networking cables to connect to the electronic device 150, and female power connections 106C that allow power cables to connect to the electronic device. Each modular device connector 100 may be configured with different port interfaces, and each modular device connector may be designed to fit to a specific electronic device with ports spaced apart in a manner that matches the ports of the electronic device. In other cases, the modular device connector 100 may be dimensioned to couple to multiple different electronic devices.

In some cases, the device-side support structure 102 may be attached directly to the electronic device, and in some cases, an intermediary member may be positioned between the device-side support structure 102 and the electronic device. The intermediary member may allow a device-side support structure 102 designed for another device to be attached to the electronic device 150. Thus, such an intermediary member may act as an adapter that allows generic modular device connectors or device connectors designed for other electronic devices to be used with electronic devices of different sizes and shapes. In some cases, the modular device connector 100 may include a clasp that is configured to hold the interlocked rack-side support structure and device-side support structure in place. Thus, regardless of which device is coupled to the device-side support structure 102, or whether an intermediary adapter is used, the rack-side support structure 101 may remain connected to the device-side support structure 102 until the clasp is released.

Figure 11A:
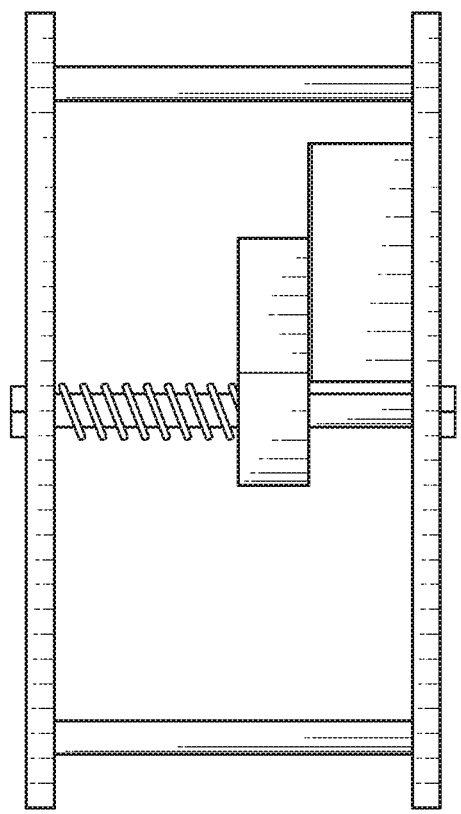
FIGS. 11A and 11B illustrate front and top views, respectively, of an embodiment of a rack container with a spring-loaded clip to hold electronic devices in place.
Figure 11B:
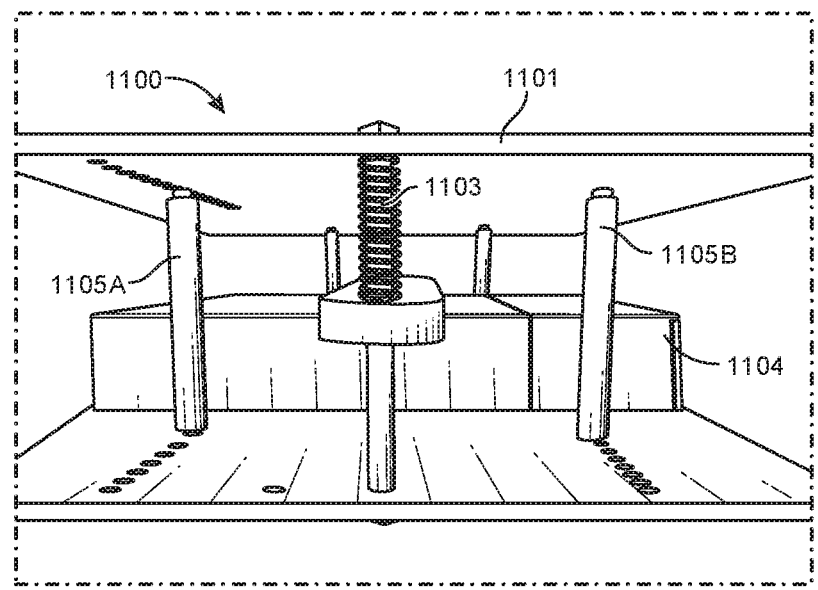

FIG. 11A illustrates an embodiment of a rack compartment that may be used within rack 160 of FIG. 6. The rack compartment 1100 may include two outer pieces 1101 on either side, surrounding the electronic device 1104. The outer pieces 1101 may be held in place via structural pins 1105A, 1105B, and others. The electronic device 1104 may be held in place via a spring-loaded pin or clip 1103. The spring-loaded pin may include a holding member that presses up against the electronic device 1104. This rack compartment 1100 may be configured to hold one or more electronic devices 1104. A device-side support structure 102 may attach to the back of the electronic device 1104 and, thus, when the rack compartment 1100 is removed from the rack 160, the electronic device and corresponding device-side support structure 102 are also removed. Conversely, when a rack compartment 1100 is added to the rack 160, the adapter-side mating end of the device-side support structure 102 may connect to the adapter-side mating end of the rack-side support structure 101. As such, a user may connect or disconnect a device under test (e.g., device 1104) simply by sliding the rack compartment 1100 into the rack 160 or pulling the rack compartment out of the rack. In some cases, the rack compartment 1100 may be may be dimensioned for a specific type of rack, while in other cases, the rack compartment may be dimensioned to couple to multiple different types of device racks.

Figure 12:
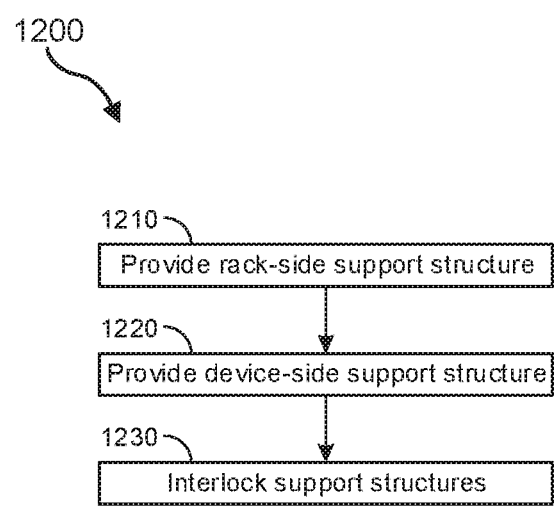
FIG. 12 is a flow diagram of an exemplary method of manufacturing a modular device connector.

In addition, a corresponding system may include a rack-side support structure dimensioned to hold at least one two-sided port interface. The two-sided port interface may include a rack-side mating end and an adapter-side mating end. The rack-side mating end may be configured to interface with various supply cables configured to provide input/ output (I/O) channels to different electronic devices. The adapter-side mating end may be configured to interface with an opposite adapter-side mating end of another port interface. The system may also include a device-side support structure dimensioned to hold at least one two-sided port interface including an opposing adapter-side mating end and a device-side mating end. The opposing adapter-side mating end may be configured to interface with the adapter-side mating end of the rack-side's port interface. The device-side mating end may interface with supply cables that connect to the electronic devices. The rack-side support structure may be configured to interlock with the device-side support structure, aligning the adapter-side mating end of the rack-side support structure's port interface with the opposing adapter-side mating end of the device-side's port interface. As such, when interlocked, the rack-side supply cables connect through the rack-side and device-side port interfaces to the electronic devices FIG. 12 is a flow diagram of an exemplary method of manufacturing 1200 for creating a modular device connector. The steps shown in FIG. 12 may be performed by any suitable computer-executable code and/or computing system in conjunction with one or more pieces of manufacturing equipment. In one example, each of the steps shown in FIG. 12 may represent an algorithm whose structure includes and/or is represented by multiple sub-steps, examples of which will be provided in greater detail below.

As illustrated in FIG. 12, at step 1210, a manufacturer of a modular device connector may provide a rack-side support structure (e.g., 101 of FIG. 1) dimensioned to hold at least one two-sided port interface (e.g., 105A). The two-sided port interface 105A may include a rack-side mating end 105A1 and an adapter-side mating end 105A2. The rack-side mating end 105A1 may be configured to interface with various supply cables (e.g., 125) configured to provide input/output (I/O) channels to different electronic devices (e.g., 150). The adapter-side mating end 105A2 may be configured to interface with an opposite adapter-side mating end of another port interface (e.g., 106A1 of port interface 106A). The rack-side support structure 101 may be manufactured using injection molds, 3D printing, casting, or other similar processes. In some cases, each of the component parts may be manufactured separately and later assembled using fasteners such as nails, screws, nuts and bolts, clips, glue, or other fasteners.

The method of manufacturing may also include, at step 1220, providing a device-side support structure (e.g., 102) dimensioned to hold a two-sided port interface (e.g., 106A) including an opposing adapter-side mating end 106A1 and a device-side mating end 106A2. The opposing adapter-side mating end 106A1 may be configured to interface with the adapter-side mating end 105A2 of the rack-side's port interface 105A, and the device-side mating end 106A2 may interface with supply cables that connect to the various electronic devices 150. Like the rack-side support structure 101, the device-side support structure 102 may be manufactured using any of the above-identified methods or other similar production methods.

In some embodiments, the method of manufacturing 1200 may further include, at step 1230, interlocking the rack-side support structure 101 with the device-side support structure 102 to align the adapter-side mating end (e.g., 105A2) of the rack-side support structure's port interface with the opposing adapter-side mating end (e.g., 106A1) of the device-side's port interface. When the rack-side support structure and the device-side support structure are thus interlocked, the rack-side supply cables (e.g., 125) may connect through the rack-side and device-side port interfaces to the electronic device 150.

Thus, the rack-side support structure 101 and the device-side support structure may act as intermediary members that allow cables from a rack to be connected to cable ports on an electronic device without a user having to reach back behind the electronic device and fish for cables and try to find the proper ports. Rather, the user may simply slide the electronic device (having the device-side support structure 102 attached thereto) to the back of the rack and into the space 110 provided by the rack-side support structure 101. The electronic device 150 may thus interlock with the rack-side support structure 101 and provide a secure connection to the rack-side cables with very little time or effort expended by the user managing the electronic devices.

EXAMPLE EMBODIMENTS

1. An apparatus, comprising a rack-side support structure dimensioned to hold at least one two-sided port interface, the two-sided port interface including a rack-side mating end and an adapter-side mating end, wherein the rack-side mating end is configured to interface with one or more supply cables configured to provide input/output (I/O) channels to one or more electronic devices, and wherein the adapter-side mating end is configured to interface with an opposite adapter-side mating end of another port interface; and a device-side support structure dimensioned to hold at least one two-sided port interface including an opposing adapter-side mating end and a device-side mating end, wherein the opposing adapter-side mating end is configured to interface with the adapter-side mating end of the rack-side's port interface, wherein the device-side mating end interfaces with one or more supply cables that connect to the one or more electronic devices, and wherein the rack-side support structure is configured to interlock with the device-side support structure, aligning the adapter-side mating end of the rack-side support structure's port interface with the opposing adapter-side mating end of the device-side's port interface, such that when interlocked, the rack-side supply cables connect through the rack-side and device-side port interfaces to the one or more electronic devices.

2. The apparatus of claim 1, wherein the rack-side support structure is coupled to a device rack.

3. The apparatus of claim 2, wherein the rack includes a spring-loaded compartment configured to hold the one or more electronic devices in place.

4. The apparatus of claim 1, wherein the device-side support structure is coupled to one of the one or more electronic devices.

5. The apparatus of claim 4, wherein the device-side support structure is configured to couple to a plurality of different consumer electronic devices.

6. The apparatus of claim 1, wherein the rack-side support structure is dimensioned to couple to a plurality of different device racks.

7. The apparatus of claim 1, wherein the rack-side support structure is dimensioned to hold a plurality of ports.

8. The apparatus of claim 7, wherein at least two of the ports are different types of ports, such that the rack-side support structure holds multiple different types of ports.

9. The apparatus of claim 1, wherein the device-side support structure is dimensioned to hold a plurality of ports.

10. The apparatus of claim 9, wherein at least two of the ports are different types of ports, such that the device-side support structure holds multiple different types of ports.

11. A system comprising: a rack-side support structure dimensioned to hold at least one two-sided port interface, the two-sided port interface including a rack-side mating end and an adapter-side mating end, wherein the rack-side mating end is configured to interface with one or more supply cables configured to provide input/output (I/O) channels to one or more electronic devices, and wherein the adapter-side mating end is configured to interface with an opposite adapter-side mating end of another port interface; and a device-side support structure dimensioned to hold at least one two-sided port interface including an opposing adapter-side mating end and a device-side mating end, wherein the opposing adapter-side mating end is configured to interface with the adapter-side mating end of the rack-side's port interface, wherein the device-side mating end interfaces with one or more supply cables that connect to the one or more electronic devices, and wherein the rack-side support structure is configured to interlock with the device-side support structure, aligning the adapter-side mating end of the rack-side support structure's port interface with the opposing adapter-side mating end of the device-side's port interface, such that when interlocked, the rack-side supply cables connect through the rack-side and device-side port interfaces to the one or more electronic devices.

12. The system of claim 11, wherein the device-side support structure is dimensioned to couple to a plurality of different electronic devices.

13. The system of claim 12, wherein at least two of the electronic devices are of different sizes.

14. The system of claim 12, wherein at least one of the electronic devices comprises a device under test.

15. The system of claim 11, wherein the rack-side support structure is slidably coupled to a device rack, such that the rack-side support structure is permitted to slide between a first position and a second position within the device rack.

16. The system of claim 15, wherein the device rack includes a support bar onto which multiple rack-side support structures are slidably coupled.

17. The system of claim 15, further comprising a clasp configured to hold the interlocked rack-side support structure and device-side support structure in place.

18. A method of manufacturing comprising: providing a rack-side support structure dimensioned to hold at least one two-sided port interface, the two-sided port interface including a rack-side mating end and an adapter-side mating end, wherein the rack-side mating end is configured to interface with one or more supply cables configured to provide input/output (I/O) channels to one or more electronic devices, and wherein the adapter-side mating end is configured to interface with an opposite adapter-side mating end of another port interface; and providing a device-side support structure dimensioned to hold at least one two-sided port interface including an opposing adapter-side mating end and a device-side mating end, wherein the opposing adapter-side mating end is configured to interface with the adapter-side mating end of the rack-side's port interface and wherein the device-side mating end interfaces with one or more supply cables that connect to the one or more electronic devices.

19. The method of manufacturing of claim 18, further comprising interlocking the rack-side support structure with the device-side support structure to align the adapter-side mating end of the rack-side support structure's port interface with the opposing adapter-side mating end of the device-side's port interface.

20. The method of manufacturing of claim 19, wherein when the rack-side support structure and the device-side support structure are interlocked, the rack-side supply cables connect through the rack-side and device-side port interfaces to the one or more electronic devices.

The method of manufacturing may be controlled by a computing system. Such computing systems and any electronic devices described herein may broadly represent any type or form of computing device or system capable of executing computer-readable instructions, such as those contained within the modules described herein. In their most basic configuration, these computing device(s) may each include at least one memory device and at least one physical processor.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the present disclosure. The embodiments disclosed herein should be considered in all respects illustrative and not restrictive. Reference should be made to the appended claims and their equivalents in determining the scope of the present disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus, comprising:
   a rack-side support structure dimensioned to hold at least one two-sided port interface, the two-sided port interface including a rack-side mating end and an adapter-side mating end; and
   a device-side support structure dimensioned to hold at least one two-sided port interface including an opposing adapter-side mating end and a device-side mating end,
   wherein the rack-side support structure is configured to interlock with the device-side support structure, aligning the adapter-side mating end of the rack-side support structure's port interface with the opposing adapter-side mating end of the device-side's port interface, such that when interlocked, one or more rack-side supply cables connect through the rack-side and device-side port interfaces to one or more electronic devices.

2. The apparatus of claim 1, wherein the rack-side support structure is coupled to a device rack.

3. The apparatus of claim 2, wherein the rack includes a spring-loaded compartment configured to hold the one or more electronic devices in place.

4. The apparatus of claim 1, wherein the device-side support structure is coupled to one of the one or more electronic devices.

5. The apparatus of claim 4, wherein the device-side support structure is configured to couple to a plurality of different consumer electronic devices.

6. The apparatus of claim 1, wherein the rack-side support structure is dimensioned to couple to a plurality of different device racks.

7. The apparatus of claim 1, wherein the rack-side support structure is dimensioned to hold a plurality of ports.

8. The apparatus of claim 7, wherein at least two of the ports are different types of ports, such that the rack-side support structure holds multiple different types of ports.

9. The apparatus of claim 1, wherein the device-side support structure is dimensioned to hold a plurality of ports.

10. The apparatus of claim 9, wherein at least two of the ports are different types of ports, such that the device-side support structure holds multiple different types of ports.

11. A system comprising:
a rack-side support structure dimensioned to hold at least one two-sided port interface, the two-sided port interface including a rack-side mating end and an adapter-side mating end; and
a device-side support structure dimensioned to hold at least one two-sided port interface including an opposing adapter-side mating end and a device-side mating end,
wherein the rack-side support structure is configured to interlock with the device-side support structure, aligning the adapter-side mating end of the rack-side support structure's port interface with the opposing adapter-side mating end of the device-side's port interface, such that when interlocked, one or more rack-side supply cables connect through the rack-side and device-side port interfaces to one or more electronic devices.

12. The system of claim 11, wherein the device-side support structure is dimensioned to couple to a plurality of different electronic devices.

13. The system of claim 12, wherein at least two of the electronic devices are of different sizes.

14. The system of claim 12, wherein at least one of the electronic devices comprises a device under test.

15. The system of claim 11, wherein the rack-side support structure is slidably coupled to a device rack, such that the rack-side support structure is permitted to slide between a first position and a second position within the device rack.

16. The system of claim 15, wherein the device rack includes a support bar onto which multiple rack-side support structures are slidably coupled.

17. The system of claim 15, further comprising a clasp configured to hold the interlocked rack-side support structure and device-side support structure in place.

18. A method of manufacturing comprising:
providing a rack-side support structure dimensioned to hold at least one two-sided port interface, the two-sided port interface including a rack-side mating end and an adapter-side mating end; and
providing a device-side support structure dimensioned to hold at least one two-sided port interface including an opposing adapter-side mating end and a device-side mating end,
wherein the rack-side support structure is configured to interlock with the device-side support structure, such that upon interlocking, the adapter-side mating end of the rack-side support structure's port interface is aligned with the opposing adapter-side mating end of the device-side's port interface.

19. The method of manufacturing of claim 18, further comprising interlocking the rack-side support structure with the device-side support structure to align the adapter-side mating end of the rack-side support structure's port interface with the opposing adapter-side mating end of the device-side's port interface.

20. The method of manufacturing of claim 19, wherein when the rack-side support structure and the device-side support structure are interlocked, the rack-side supply cables connect through the rack-side and device-side port interfaces to the one or more electronic devices.

* * * * *